US010030603B2

(12) United States Patent
Funatsu et al.

(10) Patent No.: US 10,030,603 B2
(45) Date of Patent: Jul. 24, 2018

(54) FILM FORMING APPARATUS

(71) Applicant: HONDA MOTOR CO., LTD, Minato-ku, Tokyo (JP)

(72) Inventors: Junya Funatsu, Tochigi-ken (JP); Koji Kobayashi, Tochigi-ken (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/713,901

(22) Filed: Sep. 25, 2017

(65) Prior Publication Data

US 2018/0087467 A1   Mar. 29, 2018

(30) Foreign Application Priority Data

Sep. 27, 2016   (JP) ................. 2016-188078

(51) Int. Cl.
| | | |
|---|---|---|
| F02F 1/00 | (2006.01) | |
| C23C 16/26 | (2006.01) | |
| C23C 16/50 | (2006.01) | |
| C23C 16/04 | (2006.01) | |
| C23C 16/02 | (2006.01) | |
| C23C 16/44 | (2006.01) | |

(52) U.S. Cl.
CPC .......... *F02F 1/004* (2013.01); *C23C 16/0245* (2013.01); *C23C 16/04* (2013.01); *C23C 16/042* (2013.01); *C23C 16/045* (2013.01); *C23C 16/26* (2013.01); *C23C 16/4405* (2013.01); *C23C 16/50* (2013.01); *F02F 2200/00* (2013.01); *H01J 2237/334* (2013.01)

(58) Field of Classification Search
CPC ....... F02F 1/004; F02F 2200/00; C23C 16/26; C23C 16/50; C23C 16/045; C23C 16/0245; C23C 16/4405; C23C 16/042; C23C 16/027; C23C 16/04; H01J 2237/334
See application file for complete search history.

(56) References Cited

U.S. PATENT DOCUMENTS

| | | | | |
|---|---|---|---|---|
| 8,500,907 B2* | 8/2013 | Bohnheio | ............... | B05B 12/18 |
| | | | | 118/720 |
| 2003/0154919 A1* | 8/2003 | Rice | .................. | B05B 12/20 |
| | | | | 118/504 |
| 2006/0172066 A1* | 8/2006 | Takahashi | ............ | C23C 4/16 |
| | | | | 427/236 |
| 2010/0096084 A1* | 4/2010 | Lee | ............... | H01L 21/67069 |
| | | | | 156/345.33 |
| 2010/0313746 A1* | 12/2010 | Paul | ............... | C23C 4/12 |
| | | | | 92/169.1 |
| 2010/0316798 A1* | 12/2010 | Takahashi | ........... | B05B 13/0618 |
| | | | | 427/236 |
| 2012/0252709 A1* | 10/2012 | Felts | ............... | A61M 5/3129 |
| | | | | 508/100 |

(Continued)

FOREIGN PATENT DOCUMENTS

WO   2015133490   9/2015

*Primary Examiner* — Jeffrie R Lund
(74) *Attorney, Agent, or Firm* — Amin, Turocy & Watson LLP

(57) ABSTRACT

The film forming apparatus includes a mask member and a shield member. The mask member is made of a cylindrical insulation material that can expose inner surfaces of cylinder bores, and mask the inner surface of a crankcase. The shield member is made of a metal material disposed along an inner surface of the mask member.

5 Claims, 2 Drawing Sheets

(56) References Cited

U.S. PATENT DOCUMENTS

| | | | | |
|---|---|---|---|---|
| 2013/0291823 A1* | 11/2013 | Whitbeck | ................ | C23C 4/02 |
| | | | | 123/193.2 |
| 2014/0323981 A1* | 10/2014 | Giraud | ................ | A61B 5/1438 |
| | | | | 604/218 |
| 2016/0369737 A1 | 12/2016 | Kobayashi et al. | | |
| 2017/0175668 A1* | 6/2017 | Schepak | ................ | C23C 4/14 |
| 2017/0209915 A1* | 7/2017 | Iguma | ................ | B21K 3/02 |
| 2017/0209916 A1* | 7/2017 | Iguma | ................ | B21K 3/02 |
| 2018/0087467 A1* | 3/2018 | Funatsu | ................ | F02F 1/004 |

\* cited by examiner

FILM FORMING APPARATUS

CROSS-REFERENCE TO RELATED APPLICATION

This application is based upon and claims the benefit of priority from Japanese Patent Application No. 2016-188078 filed on Sep. 27, 2016, the contents of which are incorporated herein by reference.

BACKGROUND OF THE INVENTION

Field of the Invention

The present invention relates to a film forming apparatus that forms a film on an inner surface of a cylindrical work.

Description of the Related Art

International Publication No. WO 2015/133490 discloses, for example, a technique of forming a film on an inner surface of a cylindrical work. More specifically, when a cylinder block is a work, in order to improve lubricity and abrasion resistance of inner surfaces of cylindrical cylinder bores on which pistons slide, a film made of a diamond-like carbon or the like is formed by a plasma chemical vapor deposition method.

By the way, when the cylinder block is the work, it is adequate that the film may be formed on the inner surfaces of the cylinder bores on which the pistons slide, and the film does not particularly need to be formed on an inner surface of a crankcase. Consequently, by avoiding formation of the film on the inner surface of the crankcase, it is possible to improve a film material yield. Thus, to partially form a film on the inner surface of the cylindrical work, film formation portions at which the film is formed may be exposed, and a non-formation portion at which the film is not formed may be masked by a mask member.

SUMMARY OF THE INVENTION

When a metal member is used as a mask member, electric potentials of the mask member and a cathode electrode become equal, and the film is formed on the inner surface of the mask member. Reusing the mask member in this state influences quality of the film. To avoid this influence and stabilize film formation quality, it is necessary to replace the mask member with a new mask member every time a film is formed on one work.

Removal of the film formed on the mask member requires expensive facilities such as a blast facility and further requires other processes such as a wet cleaning process and a drying process. Thus, it is concerned that an increase in time required to remove the film from the mask member and enable reuse of the mask member would substantially lower manufacturing efficiency of film deposited products and increase manufacturing cost of the film deposited products.

A main object of the present invention is to provide a film forming apparatus that can partially form a film on an inner surface of a cylindrical work efficiently at low cost while keeping good film formation quality.

One embodiment of the present invention provides a film forming apparatus configured to form a film on an inner surface of a cylindrical work, and including: a mask member of a cylindrical shape made of an insulation material, and configured to expose a film formation portion of the inner surface of the work at which the film is formed, and mask a non-formation portion of the inner surface of the work at which the film is not formed; and a shield member disposed along an inner surface of the mask member and made of a metal material.

In the film forming apparatus according to the present invention, the mask member exposes a film formation portion of the inner surface of the cylindrical work, and masks a non-formation portion, while the mask member is made of an insulation material. That is, even when a potential difference is produced between an electrode and a work during film formation, the potential difference is not produced in the mask member. Consequently, it is possible for the mask member not only to avoid formation of the film at the non-formation portion of the work but also avoid adhesion of the film to the mask member. As a result, it is possible to improve a material yield of the film, and omit expensive facilities and complicated processes for removing the film formed on the mask member.

The shield member made of metal is disposed along the inner surface of the mask member. Consequently, it is possible to avoid contact of plasma with the inner surface of the mask member and disassembly or decomposition of the mask member. Consequently, it is possible to prevent a component of the mask member from being mixed in a plasma generation space inside the work, and avoid a decrease in film formation quality. It is possible to prevent the film from adhering to the mask member and the mask member from being disassembled, so that it is possible to substantially decrease a frequency to replace the mask member.

As described above, this film forming apparatus can partially form a film on the inner surface of the cylindrical work efficiently at low cost while keeping good film formation quality.

Preferably, in the film forming apparatus, at least part of the mask member is in contact with the inner surface of the work, and the shield member is distant from the work. As described above, at least part of the mask member is in contact with the inner surface of the work. Consequently, it is possible to precisely limit a range of the work irradiated with plasma only to film formation portions. The shield member and the work are distant, so that the shield member and the work are insulated. Consequently, the film is not actively formed on the shield member. In this case, even when the film adheres to the shield member, the film can be easily removed. Consequently, it is possible to form the film more efficiently at lower cost.

Preferably, in the film forming apparatus, when the work is a cylinder block, the mask member is configured to expose an inner surface of a cylinder bore of the cylinder block as the film formation portion, and mask an inner surface of a crankcase of the cylinder block as the non-formation portion. This film forming apparatus is particularly suitably applied to form a film such as diamond-like carbon of good lubricity and abrasion resistance on an inner surface of a cylinder bore on which a piston slides, and avoid formation of the film on an inner surface of a crankcase, in the cylinder block.

Preferably, the film forming apparatus includes: a source gas supply device configured to supply a source gas of the film to a cylinder of the cylinder block; a housing configured to house the cylinder block; a closing member disposed between the source gas supply device and the housing; a manifold connected to an exhaust unit configured to exhaust a gas in the cylinder; an anode case disposed between and electrically insulated from the housing and the manifold, and made of a conductive material; and an anode electrode disposed in and electrically insulated from the anode case, and configured to produce a potential difference from the cylinder block. This film forming apparatus can obtain the above function and effect well.

Preferably, in the film forming apparatus, the shield member extends from an interior of the mask member to an interior of the anode case, and the shield member and the anode case are electrically insulated from each other. The shield member extends from the interior of the mask member to the interior of the anode case, so that it is possible to avoid adhesion of the film to the anode case. Consequently, it is possible to easily maintain the film forming apparatus.

The shield member and the anode case are electrically insulated. Consequently, the film is not actively formed on the shield member. Consequently, even when the film adheres to the shield member, it is possible to easily remove the film. The shield member and the anode case are electrically insulated. Consequently, even when a film is simultaneously formed on a plurality of cylinders of the cylinder block, it is possible to avoid interference in formation of the film on each of the cylinders, and form the film of good quality.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

A preferred embodiment of a film forming apparatus according to the present invention will be described in detail with reference to the accompanying drawings.

The film forming apparatus according to the present invention can selectively form a film at a film formation portion of an inner surface of a cylindrical work. The inner surface includes the film formation portion at which the film is formed, and a non-formation portion at which the film is not formed. This film forming apparatus is applicable to various works and is particularly suitably applicable to form a film on inner surfaces of cylindrical cylinder bores of a cylinder block.

Figure 1:
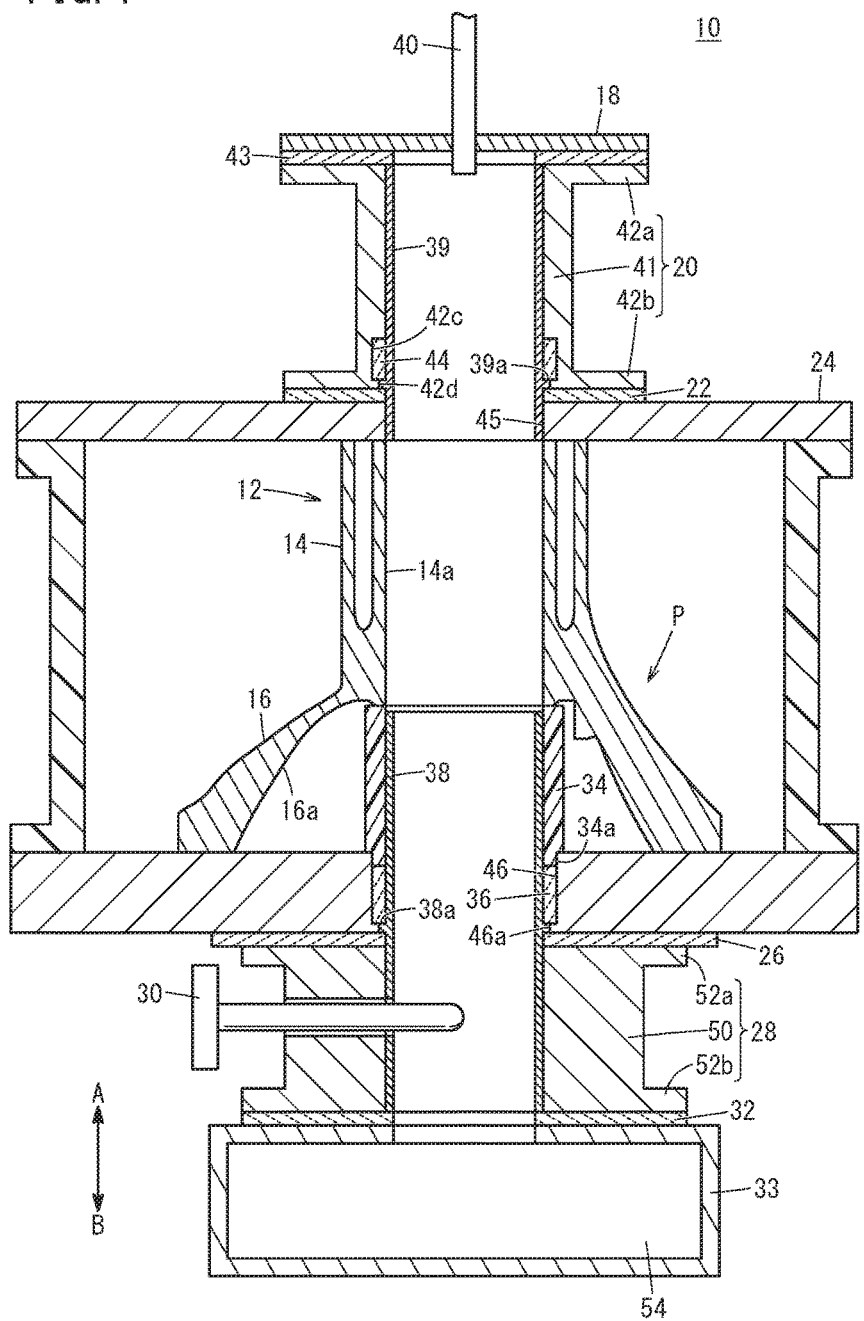
FIG. 1 is a schematic cross-sectional view of the main part of a film forming apparatus according to the present invention.

The present embodiment describes an example where, in a film forming apparatus 10 shown in FIG. 1, a multi-cylinder type cylinder block 12 is a work, inner surfaces 14a of cylinder bores 14 are film formation portions and an inner surface 16a of a crankcase 16 is a non-formation portion. However, the present invention is not limited to this example in particular.

The cylinder block 12 is a multi-cylinder type (including a plurality of cylinders) formed by aligning the plurality of cylinder bores 14 in a direction perpendicular to a sheet surface of FIG. 1. FIG. 1 shows only one of these cylinder bores 14. The cylinder block 12 is, for example, a cast product made of aluminum alloy, and is a so-called linerless type that a piston (not shown) slides inside each of the cylinder bores 14.

The piston is coupled to a crankshaft (not shown) housed in the crankcase 16 via a connecting rod (not shown). Hence, accompanying rotation of the crankshaft, the piston makes a reciprocating movement in each cylinder bore 14. To enhance a lubricating ability and a sliding property of each inner surface 14a of each cylinder bore 14, a Plasma Chemical Vapor Deposition (Plasma CVD) method by the film forming apparatus 10 is used as described below to form a film such as a diamond-like carbon (DLC) film.

The film forming apparatus 10 includes a source gas supply device (not shown), a closing member 18, a coupling case 20, a first insulation member 22, a housing 24, a second insulation member 26, an anode case 28, an anode electrode 30, a third insulation member 32, a manifold 33 connected with an exhaust unit (not shown), a mask member 34, a fourth insulation member 36 and a shield member 38. A protection member 39 is held in the coupling case 20.

The source gas supply device supplies a source gas of a film from one end side in an axial direction (the side pointed by arrow A) of the plurality of cylinders of the cylinder block 12 housed in the housing 24 to the interior of each cylinder. More specifically, the source gas supply device includes pluralities of tanks, supply pipes, valves and mass flow controllers, and further includes a collecting pipe 40 at which the plurality of supply pipes are collected. In this regard, the components other than the collecting pipe 40 are not shown.

The tanks store gas such as oxygen, argon or acetylene. Each supply pipe allows the gas to flow from each tank. The collecting pipe 40 is connected airtight with the closing member 18 via a pipe joint that is not shown. Each valve opens and closes each supply pipe and the collecting pipe 40, and each mass flow controller adjusts a flow rate of a gas flowing in each supply pipe. That is, the source gas supply device can supply a single source gas or a combination of a plurality of types of gases at an arbitrary flow rate into the coupling case 20 via the closing member 18.

The coupling case 20 includes a hollow portion 41 to which the source gas is supplied from the collecting pipe 40 via the closing member 18, and flange portions 42a, 42b formed at both end sides in the axial direction (the sides pointed by arrows A and B) of the hollow portion 41. The hollow portion 41 is closed by the closing member 18. The closing member 18 is fixed to the coupling case 20 by screws or the like via the one flange portion 42a. An insulation sheet 43 is interposed between the closing member 18 and the coupling case 20. The insulation sheet 43 is made of, for example, an insulation material such as ceramics.

At another end side (the side pointed by the arrow B) of the coupling case 20, a large hole 42c and a small hole 42d are formed continuing to each other in this order from an upstream side to which the source gas is supplied. An annular protrusion portion 39a is formed on an outer circumferential surface of the protection member 39, and enters the small hole 42d. Meanwhile, an insulation ring 44 formed by an insulation body engages with the large hole 42c.

The flange portion 42b of the coupling case 20 is fixed to the housing 24 by screws or the like. The first insulation member 22 is interposed between the coupling case 20 and the housing 24 to electrically insulate. The first insulation member 22 is made of, for example, an insulation material such as ceramics.

Hence, the annular protrusion portion 39a is sandwiched between the insulation ring 44 and the first insulation member 22 from both sides in the axial direction, and therefore is positioned and fixed inside the hollow portion 41.

The outer circumferential surface of the annular protrusion portion 39a is distant from an inner circumferential surface of the small hole 42d, and an outer circumferential surface of the protection member 39 is distant from an inner circumferential surface of the hollow portion 41. Therefore, the protection member 39 is electrically insulated from the coupling case 20.

The housing 24 is made of a conductive material such as metal, and houses the cylinder block 12. Both end surfaces in the axial direction of the cylinders of the cylinder block 12, and an inner wall surface of the housing 24 are in contact. In a wall portion of the housing 24 facing toward openings of the cylinder bores 14 at one end side in the axial direction (the side pointed by the arrow A) of the cylinders, each of openings 45 is formed. The hollow portion 41 of the coupling case 20 and the interior of each cylinder of the cylinder block 12 communicate via this opening 45.

The other end side in the axial direction (the side pointed by the arrow B) of the protection member 39 enters the opening 45. The outer circumferential surface of the protection member 39 is slightly distant from an inner circumferential surface of the opening 45. This distance electrically insulates the protection member 39 and the housing 24.

Figure 2:
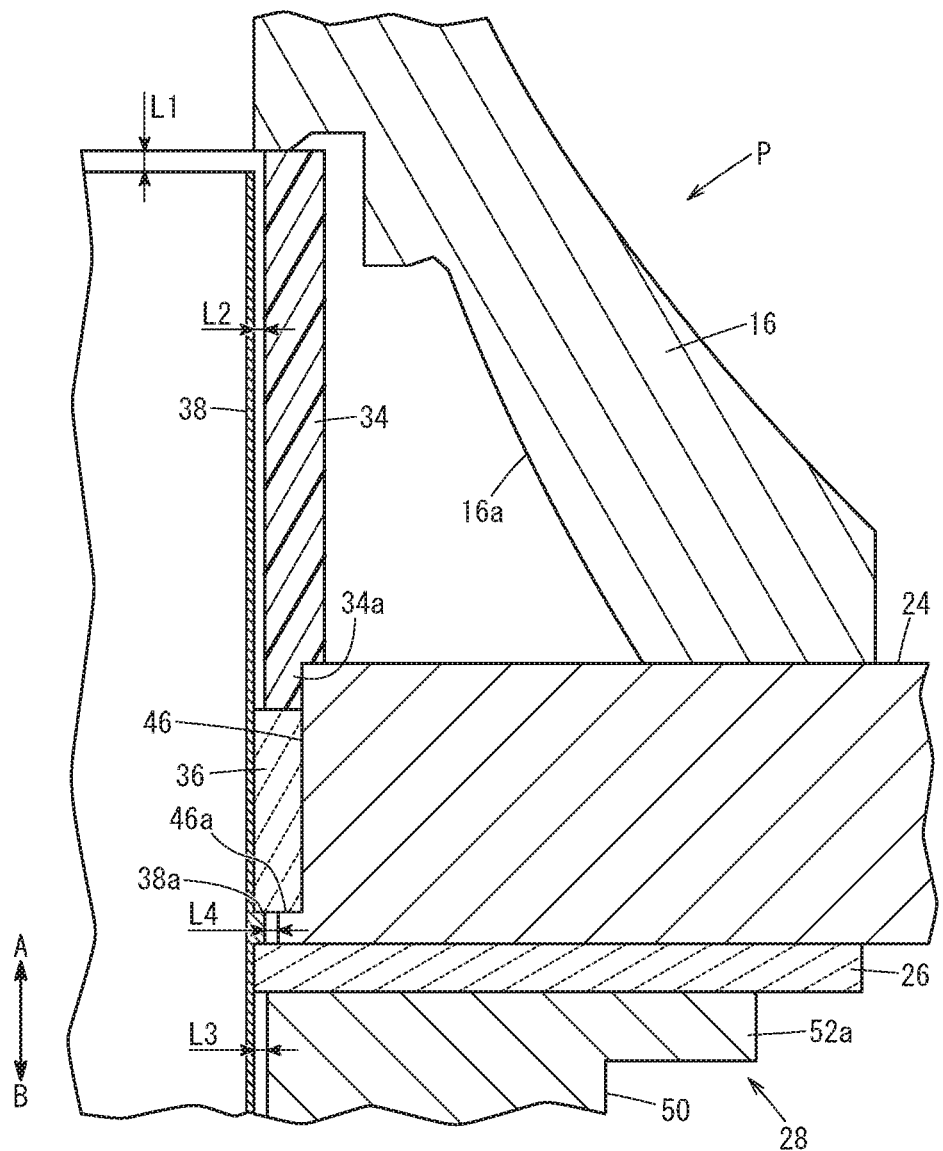
FIG. 2 is an enlarged view of a part indicated by an arrow P in FIG. 1.

In a wall portion of the housing 24 facing toward the crankcase 16 at the other end side in the axial direction (the side of the arrow B direction) of the cylinders, an opening 46 is formed and is coaxial with the opening 45. As shown in FIG. 2, also, the opening 46 includes a small inner diameter portion 46a at the other end side in the axial direction (the side pointed by the arrow B), and is formed stepwise.

The housing 24 is electrically connected to a bias power supply via leads that are not shown, and is thereby applied a negative bias. The negative bias is also applied to the cylinder block 12, which is in contact with the housing 24, so that the cylinder block 12 functions as a cathode electrode.

The second insulation member 26 is made of, for example, an insulation material such as ceramics, and is disposed between the housing 24 and the anode case 28 to electrically insulate them from each other. As shown in FIG. 2, the second insulation member 26 is arranged slightly protruding toward an axial center of a hollow portion 50 compared to the inner wall surface of the anode case 28.

The anode case 28 is made of a conductive material such as metal, and includes the hollow portion 50 that communicates with the cylinder bores 14 via the opening 46, and flange portions 52a, 52b that are formed at both end sides in the axial direction of the hollow portion 50. The anode case 28 is fixed to the housing 24 by screws or the like via the one flange portion 52a, and is fixed to the manifold 33 by screws or the like via the other flange portion 52b.

Hence, in the film forming apparatus 10, the collecting pipe 40 of the source gas supply device, the hollow portion 41 of the coupling case 20, the interior of the cylinders of the cylinder block 12 via the opening 45 of the housing 24, the hollow portion 50 of the anode case 28 via the opening 46 of the housing 24, and a chamber 54 in the manifold 33, communicate with each other.

The anode electrode 30 is disposed in and electrically insulated from the anode case 28, and is grounded. Consequently, it is possible to produce a potential difference between the housing 24 and the cylinder block 12 to which the negative bias has been applied, and the anode electrode 30.

The third insulation member 32 is made of, for example, an insulation material such as ceramics, and is disposed between the anode case 28 and the manifold 33 to electrically insulate them from each other.

The mask member 34 is a cylindrical body made of, for example, an insulation material such as polytetrafluoroethylene (PTFE). More specifically, one end side in the axial direction (the side pointed by arrow A) of the mask member 34 contacts a border portion between the cylinder bores 14 and the crankcase 16 in the cylinders of the cylinder block 12. A small outer diameter portion 34a is formed at another end side in the axial direction (the side pointed by the arrow B) of the mask member 34, and is inserted in the opening 46 of the housing 24. By this means, in a state where the mask member 34 exposes the inner surface 14a (film formation portion) of the cylinder bore 14, and masks the inner surface 16a (non-formation portion) of the crankcase 16, the mask member 34 is held in the housing 24.

The fourth insulation member 36 electrically insulates the shield member 38 and the housing 24, and is a cylindrical body made of, for example, an insulation material such as ceramics. More specifically, the fourth insulation member 36 is disposed coaxially with the opening 46 between the small outer diameter portion 34a of the mask member 34 and the small inner diameter portion 46a in the opening 46. As shown in FIG. 2, an inner diameter of the fourth insulation member 36 is formed slightly smaller than inner diameters of the mask member 34 and the small inner diameter portion 46a. Hence, an inner circumferential surface of the fourth insulation member 36 slightly protrudes toward the axial center compared to the mask member 34 and the small inner diameter portion 46a.

The shield member 38 is a cylindrical body made of, for example, a metal material such as stainless steel, and is disposed coaxially with the mask member 34 and along an inner surface of the mask member 34. The shield member 38 and the cylinder block 12 are distant from each other (are not in contact) and electrically insulated. More specifically, as shown in FIG. 2, the shield member 38 extends from an end portion which is near one axial end portion (end portion in the arrow A) of the mask member 34 but is distant from the one axial end portion by a distance L1 toward another axial end portion (end portion in the arrow B) of the mask member 34. Also, the shield member 38 extends to the interior of the anode case 28 along an inner circumferential surface of the mask member 34. That is, the one axial end portion of the mask member 34 protrudes along the axial direction by the distance L1 compared to the shield member 38 and is in contact with the cylinder block 12. Hence, one end portion of the shield member 38 is not in contact with the cylinder block 12.

An outer circumferential surface of the shield member 38 is in contact with an inner circumferential surface of the fourth insulation member 36 protruding toward the axial center. Hence, there is a distance L2 between the outer circumferential surface of the shield member 38 and the inner circumferential surface of the mask member 34, and there is a distance L3 between the outer circumferential surface of the shield member 38 and the inner wall surface of the anode case 28.

An annular protrusion portion 38a is formed on the outer circumferential surface of the shield member 38, and protrudes toward the small inner diameter portion 46a of the opening 46. This annular protrusion portion 38a is engaged (sandwiched) between the second insulation member 26 and the fourth insulation member 36, so that the shield member 38 is positioned and fixed to the housing 24 or the like. There is a distance L4 between an outer circumferential surface of the annular protrusion portion 38a and an inner circumferential surface of the small inner diameter portion 46a. The above distances electrically insulate the shield member 38 from the housing 24 and the anode case 28.

The lengths of the distances L1 to L4 are set to avoid contact between, in other words, to electrically insulate between the shield member 38 and the cylinder block 12, between the shield member 38 and the housing 24, and between the shield member 38 and the anode case 28 and the like when the shield member 38 etc. thermally expands during film formation processing of the film forming apparatus 10. Consequently, it is possible to prevent a negative bias from being applied to the shield member 38 and causing energy loss, and the film from adhering to the shield member 38. The same applies to the protection member 39, too.

For example, the preferable length of the distance L1 is 1.0 to 2.0 mm. In this case, as described above, even when thermal expansion occurs, it is possible to avoid contact between the shield member 38 and the cylinder block 12, and sufficiently avoid adhesion of the film to the mask member 34.

The preferable length of the distance L2 is 1.0 mm or less. In this case, as described above, even when thermal expansion occurs, it is possible to avoid contact between the shield member 38 and the cylinder block 12, and avoid production of plasma between the shield member 38 and the mask member 34 and adhesion of the film to the mask member 34.

The preferable length of the distance L3 is 0.5 to 1.5 mm. In this case, as described above, even when thermal expansion occurs, it is possible to avoid contact between the shield member 38 and the anode case 28. Consequently, even when a film is simultaneously formed on the plurality of cylinders, it is possible to avoid instability of the plasma and improve film formation quality. Further, it is possible to avoid production of the plasma between the shield member 38 and the anode case 28, and avoid adhesion of the film.

The preferable length of the distance L4 is 0.5 to 1.5 mm. In this case, as described above, even when thermal expansion occurs, it is possible to avoid contact between the shield member 38 and the housing 24, and avoid production of plasma between the shield member 38 and the housing 24, and avoid adhesion of the film.

The film forming apparatus 10 according to the present embodiment is basically configured as described above. Next, a function and an effect of the film forming apparatus 10 will be described in relation to an operation of forming a film on the inner surface 14a (film formation portion) of the cylinder bore 14 by using the film forming apparatus 10.

First, the cylinder block 12 is housed in the housing 24. In this case, in the housing 24, the mask member 34 is disposed to expose the inner surface 14a of the cylinder bore 14 and mask the inner surface 16a of the crankcase 16, and the shield member 38 is disposed along the inner surface of the mask member 34. Next, a vacuum pump etc. that is an exhaust unit is energized to exhaust air from the chamber 54. Thus, the air is exhausted from the hollow portion 50 of the anode case 28, the interior of the cylinder of the cylinder block 12, and the interior of the hollow portion 41, and the collecting pipe 40 of the coupling case 20.

Next, a source gas unit starts supplying an oxygen gas via the collecting pipe 40. At the same time as, or before or after start of supply of this oxygen gas, the bias power supply is energized to apply the negative bias to the cylinder block 12 via the housing 24. As a result, the potential difference is formed between the anode electrode 30 and the cylinder block 12, and the oxygen gas is converted to the plasma state in the coupling case 20 to generate oxygen plasma. Predetermined energy is applied to the oxygen gas during the plasm conversion, and therefore the oxygen plasma has a higher temperature than that of the oxygen gas.

The oxygen plasma having the high temperature cleans and performs so-called plasma etching on the interior of the hollow portion 41 of the coupling case 20, the inner surfaces 14a of the cylinder bores 14 and the inner surface of the shield member 38.

Next, the source gas unit stops supplying the oxygen gas, and starts supplying an argon gas and an acetylene gas instead of the oxygen gas. The argon gas is converted to the plasma state under actions of the cylinder block 12 that functions as a cathode to which the negative bias is applied, and the anode electrode 30. Similarly, the acetylene gas is also converted to the plasma state, so that the argon plasma and the acetylene plasma are generated.

The acetylene plasma and the active argon plasma are active gases, so that active carbon is generated from the acetylene as a source. The carbon is attracted, adhered and deposited to the inner surface 14a of the cylinder bore 14 of the cylinder block 12 by an electrical action. Thus, the film made of diamond-like carbon is formed. When this film has a desired thickness, the source gas supply device stops supplying the argon gas and the acetylene gas, and finishes the film formation processing.

The film forming apparatus 10 according to the present embodiment includes the mask member 34 made of the insulation material as described above. Consequently, it is possible to avoid formation of the film on the inner surface 16a of the crankcase 16, and adhesion of the film to the mask member 34. As a result, it is possible to improve the material yield of the film, and omit expensive facilities and complicated processes for removing the film formed on the mask member 34.

The shield member 38 made of metal is disposed along the inner surface of the mask member 34. Consequently, it is possible to avoid contact of the plasma with the inner surface of the mask member 34, and avoid disassembly or decomposition of the mask member 34. Consequently, it is possible to prevent the component of the mask member 34 from being mixed in the plasma production space in the cylinders of the cylinder block 12, and avoid a decrease in film formation quality. Further, it is possible to prevent the film from adhering to the mask member 34 and the mask member 34 from being disassembled or decomposed. Consequently, it is possible to substantially reduce a frequency to replace the mask member 34.

As described above, in the film forming apparatus 10, the one end side in the axial direction (the side pointed by the arrow A) of the mask member 34 is in contact with the border portion between the cylinder bore 14 and the crankcase 16 in the cylinder of the cylinder block 12. Consequently, it is possible to precisely limit a plasma irradiation range to irradiate the inner surface 14a of the cylinder bore 14 with plasma and shield the inner surface 16a of the crankcase 16 from plasma irradiation. That is, it is possible to stabilize film formation quality.

As described above, in the film forming apparatus 10, the cylinder block 12, the housing 24, and the anode case 28 are distant from the shield member 38, and are insulated from each other. Consequently, it is possible to avoid formation of the film on the shield member 38. Consequently, it is also possible to reuse the shield member 38 that is used for film formation without maintaining the shield member 38. Consequently, it is possible to reduce cost of equipment investment, and efficiently form films a plurality of times. Further, it is also possible to avoid an influence on film quality.

Just in case the film adheres to the shield member 38, the adhesion amount is a very little. Consequently, by performing plasma etching using the oxygen plasma, it is possible to easily remove the film adhered to the shield member 38.

As described above, in the film forming apparatus 10, the shield member 38 extends from the interior of the mask member 34 to the interior of the anode case 28. Consequently, it is possible to avoid adhesion of the film to the inner wall of the anode case 28.

The protection member 39 is arranged on the inner circumferential surface of the coupling case 20, too. Consequently, it is possible to avoid adhesion of the film similar to the inner circumferential surface of the anode case 28. The protection member 39 is electrically insulated from the coupling case 20 and the housing 24. Consequently, it is possible to prevent the film from being formed on the protection member 39 similar to the shield member 38, and easily remove the film even when the film adheres. Consequently, it is possible to easily maintain the film forming apparatus 10.

As described above, this film forming apparatus 10 can form the film on the inner surface 14*a* of the cylinder bore 14 efficiently at low cost while keeping good film formation quality.

The present invention is not particularly limited to the above embodiment, and can be variously modified without departing from the gist of the invention.

For example, in the film forming apparatus 10 according to the embodiment, the distance L2 is provided between the outer circumferential surface of the shield member 38 and the inner circumferential surface of the mask member 34. However, the film forming apparatus 10 is not limited to this feature in particular. The outer circumferential surface of the shield member 38 and the inner circumferential surface of the mask member 34 may be in contact.

In the film forming apparatus 10 according to the embodiment, the shield member 38 extends to the interior of the anode case 28 yet is not limited to this feature in particular. The shield member 38 only needs to be disposed along the mask member 34.

What is claimed is:

1. A film forming apparatus configured to form a film on an inner surface of a cylindrical work, the film forming apparatus comprising:

a mask member of a cylindrical shape made of an insulation material, and configured to expose a film formation portion of the inner surface of the work at which the film is formed, and mask a non-formation portion of the inner surface of the work at which the film is not formed; and a shield member disposed along an inner surface of the mask member and made of a metal material.

2. The film forming apparatus according to claim 1, wherein:

at least part of the mask member is in contact with the inner surface of the work; and the shield member is distant from the work.

3. The film forming apparatus according to claim 1, wherein, when the work is a cylinder block, the mask member is configured to expose an inner surface of a cylinder bore of the cylinder block as the film formation portion, and mask an inner surface of a crankcase of the cylinder block as the non-formation portion.

4. The film forming apparatus according to claim 3, further comprising:

a source gas supply device configured to supply a source gas of the film to a cylinder of the cylinder block;

a housing configured to house the cylinder block;

a closing member disposed between the source gas supply device and the housing;

a manifold connected to an exhaust unit configured to exhaust a gas in the cylinder;

an anode case disposed between and electrically insulated from the housing and the manifold, and made of a conductive material; and an anode electrode disposed in and electrically insulated from the anode case, and configured to produce a potential difference from the cylinder block.

5. The film forming apparatus according to claim 4, wherein:

the shield member extends from an interior of the mask member to an interior of the anode case; and the shield member and the anode case are electrically insulated from each other.

* * * * *